United States Patent
Douillard et al.

(10) Patent No.: US 11,297,743 B2
(45) Date of Patent: Apr. 5, 2022

(54) ACTIVE COOLING CIRCUIT FOR ELECTRICAL EQUIPMENT

(71) Applicant: Valeo Siemens eAutomotive France SAS, Cergy (FR)

(72) Inventors: Sébastien Douillard, L'Isle Adam (FR); Anthony Lamarche, Villepreux (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 0 days.

(21) Appl. No.: 16/891,832

(22) Filed: Jun. 3, 2020

(65) Prior Publication Data
US 2020/0390008 A1    Dec. 10, 2020

(30) Foreign Application Priority Data

Jun. 6, 2019 (FR) ..................................... 1905993

(51) Int. Cl.
*H05K 7/20* (2006.01)
(52) U.S. Cl.
CPC ..... *H05K 7/20927* (2013.01); *H05K 7/20272* (2013.01)
(58) Field of Classification Search
CPC ........... H05K 7/20254; H05K 7/20272; H05K 7/20509; H05K 7/20927
See application file for complete search history.

(56) References Cited

U.S. PATENT DOCUMENTS

| 7,578,337 | B2 | 8/2009 | Spokoiny et al. | |
|---|---|---|---|---|
| 2001/0014029 | A1* | 8/2001 | Suzuki | H05K 7/20927 363/141 |
| 2014/0009886 | A1* | 1/2014 | Moon | H05K 9/0007 361/699 |
| 2015/0021756 | A1* | 1/2015 | Adachi | H01L 23/3672 257/714 |

(Continued)

FOREIGN PATENT DOCUMENTS

WO    WO 2016/195570 A1    12/2016

OTHER PUBLICATIONS

Search Report from French Intellectual Property Office on corresponding FR application (FR1905993) dated Mar. 2, 2020.

*Primary Examiner* — Jacob R Crum
(74) *Attorney, Agent, or Firm* — Klein, O'Neill & Singh, LLP

(57) ABSTRACT

The invention relates to a cooling circuit, notably for a casing of an electrical equipment, comprising a first portion and a second portion, said first and second portions of the cooling circuit being complementary and respectively comprising hollow parts and projecting parts configured to fit one into the other so as to form by assembly a circulation channel for a coolant, said circulation channel being configured to generate a flow extending over different levels laid out successively one after the other along said circulation channel,
said hollow parts and said projecting parts being configured to fit one into the other thanks to a functional clearance enabling the imbrication of said hollow parts and said projecting parts, one at least of said first and second complementary circuit portions comprising at least one deflector configured to divert the coolant from said functional clearance.

11 Claims, 8 Drawing Sheets

(56) References Cited

U.S. PATENT DOCUMENTS

| | | | |
|---|---|---|---|
| 2015/0091151 A1* | 4/2015 | Kulas | H01L 23/473 257/690 |
| 2015/0245535 A1* | 8/2015 | Fujita | H05K 7/20927 361/689 |
| 2017/0006731 A1* | 1/2017 | Higashi | H05K 7/1432 |
| 2017/0332522 A1* | 11/2017 | Ushijima | H05K 7/20281 |
| 2018/0219488 A1* | 8/2018 | Nakamura | H05K 7/20927 |
| 2019/0045661 A1 | 2/2019 | Broderick et al. | |
| 2020/0068749 A1* | 2/2020 | Ono | H05K 7/20927 |

\* cited by examiner

PRIOR ART

ACTIVE COOLING CIRCUIT FOR ELECTRICAL EQUIPMENT

TECHNICAL FIELD

The present invention relates to the field of the active cooling of electronic components of electrical equipment. In particular, the invention relates to a cooling circuit in which a coolant is configured to circulate, in an electrical equipment.

More precisely, the invention targets, in an electrical equipment, in particular of electric charger type, comprising a convoluted cooling circuit, notably "three dimensional", to preventing the coolant from getting inside a functional clearance, that is to say an interstice existing between two complementary portions constituting said cooling circuit of said electrical equipment.

BACKGROUND

In an electrical equipment, such as a DC-DC converter or an on-board charger (OBC), it is known that a cooling circuit is integrated in the frame of the equipment, to ensure active cooling of components of the electrical equipment, notably by circulation of a coolant, for example a cooling liquid such as water or glycol.

Notably, such a cooling circuit may be formed from two complementary parts. In this case, for example, a frame and a cover of an electrical equipment comprise complementary portions of a cooling circuit. Said complementary portions comprise channels, hollow parts or protuberances, such that the cooling circuit obtained by assembly may notably extend in a "three dimensional" manner, in the sense that the path followed by the coolant undergoes changes of direction in three non-coplanar directions. In other words, the circulation channel then comprises successive levels at different levels.

In this case, in particular, the complementary parts, which comprise the complementary portions of the cooling circuit, are designed in such a way that there exists a functional clearance enabling the mounting and the imbrication of said complementary parts one in the other. This functional clearance 50 is represented in FIG. 1, which shows a section of a circulation channel comprising complementary interleaved portions. The coolant is assumed to be conveyed in the channel 10A, but a part gets inside the functional clearance 50 existing between the complementary portions 1A, 2A forming the circulation channel 10A. In other words, the functional clearance 50 is a space between the first part 1A and the second part 2A subsisting between the respective walls of said first and second parts 1A, 2A after their imbrication one in the other.

Yet, even if a seal is provided to be sandwiched between the flat edges of said complementary portions in plane-plane contact on a peripheral portion corresponding to these edges, the functional clearance configured to enable the interlocking of the complementary portions is exploited by the coolant of which a part leaves the "three dimensional" circulation channel of the cooling circuit to get inside the functional clearance enabling the interlocking of the complementary parts.

This coolant which gets inside said functional clearance induces pressure losses and losses of cooling efficiency.

The present invention aims to reduce these pressure losses and these thermal losses, notably in the context of an electrical equipment comprising two complementary parts each comprising a portion of cooling circuit, forming, once assembled, a "three dimensional" circulation channel for a cooling circuit, a functional clearance being provided between said complementary portions to enable their interlocking and the formation of said circulation channel.

To this end, the present invention provides the putting in place of deflectors, in the circulation channel, to prevent the coolant from being introduced into the functional clearance.

SUMMARY OF THE INVENTION

More precisely, the present invention targets a cooling circuit, notably for a casing of an electrical equipment, comprising a first portion and a second portion, said first and second portions of the cooling circuit being complementary and respectively comprising hollow parts and projecting parts configured to fit one into the other so as to form by assembly a circulation channel for a coolant, said circulation channel being configured to generate a flow of coolant extending over different levels laid out successively one after the other along said circulation channel, said hollow parts and said projecting parts being configured to fit one into the other thanks to a functional clearance enabling the imbrication of said hollow parts and said projecting parts, one at least of said first and second complementary circuit portions comprising at least one deflector configured to divert the coolant from said functional clearance.

Thanks to the invention, the quantity of coolant liable to get inside said functional clearance outside of the cooling channel is thus reduced.

According to an embodiment, said at least one deflector comprises a rib projecting into one at least of said first and second complementary circuit portions.

According to an embodiment, said at least one deflector comprises a groove hollowed out in one at least of said first and second complementary circuit portions.

According to an embodiment, said at least one deflector comprises a rib and a groove respectively arranged on one and the other of said first and second portions of cooling circuit, said rib and said groove being configured so that the rib engages in said groove during the interlocking of said first and second portions of cooling circuit.

Advantageously, the circulation channel of the coolant has a substantially constant transversal section.

According to an embodiment, the cooling circuit has a median plane comprising at least one contact line between the first and second portions of cooling circuit, said circulation channel comprising at least one section forming a drop off, in a direction non-parallel to said median plane, and said section extending between two successive levels of said circulation channel.

According to an embodiment, said at least one deflector is arranged upstream or downstream of said at least one drop off and extends in a direction orthogonal to the sense of circulation of the coolant.

According to an embodiment, the cooling circuit comprises a pair of deflectors, facing each other, arranged on either side of the circulation channel, upstream or downstream of said at least one drop off.

According to an embodiment, said first and second portions of cooling circuit respectively comprise a flat border belonging to the median plane, said first and second portions of cooling circuit being in plane-plane contact along their flat border.

According to an embodiment, the circulation channel for coolant furthermore comprises at least one guiding rib, preferably at least two parallel guiding ribs, arranged on at least one section of at least one of said first and second complementary circuit portions, in the sense of circulation of the coolant, to participate in the guiding of the coolant in the circulation channel.

The invention also targets a casing for an electrical equipment, said casing comprising a cooling circuit such as briefly described above, wherein a first casing part comprises the first portion of cooling circuit and a second casing part comprises the second portion of cooling circuit, said first casing part comprising a housing configured to receive electronic components of said electrical equipment, said housing being opposite to the first portion of the cooling circuit, and the second casing part forming a cover configured to come on one face of the casing opposite to said housing so as to form said cooling circuit.

The invention also targets an electrical equipment comprising a casing such as briefly described above and electronic components arranged in said housing of the casing at different distances from a plane comprising a contact line between the first and second casing parts, electrical equipment wherein the circulation channel is configured to convey the coolant near to said electronic components so as to cool them.

According to an embodiment, said electrical equipment forms a DC-DC voltage converter, and/or an inverter and/or an electric charger, for electric or hybrid vehicle.

BRIEF DESCRIPTION OF THE DRAWINGS

The invention will be better understood on reading the description that follows, given uniquely as an example, and by referring to the appended drawings given as non-limiting examples, in which identical references are given to similar objects and in which:

FIG. 1 (already described) shows a sectional view of a circulation channel in a cooling circuit of the prior art, with a functional clearance allowing the passage of coolant;

FIG. 2 shows a sectional side view of a cooling circuit formed of two complementary portions;

FIG. 3 is an exploded view of a cooling circuit of electrical equipment according to the invention, with a first part forming a frame and a second part forming a cover;

FIG. 4A is a schematic representation of an example of first portion of cooling circuit, showing ribs of deflectors;

FIG. 4B represents the same example of a first portion of cooling circuit as in FIG. 4A, seen from the opposite face;

FIG. 5 is a schematic representation zoomed on a portion of three dimensional channel of the cooling circuit;

FIG. 6 is a schematic representation showing guiding ribs in the three dimensional channel of the cooling circuit;

FIG. 7 is a schematic representation of an example of the second cooling circuit part, forming a cover of the electrical equipment, showing grooves of deflectors, notably complementary to the ribs visible in FIG. 4A.

It should be noted that the figures set out the invention in a detailed manner for implementing the invention, said figures obviously being able to serve to better define the invention if need be.

DETAILED DESCRIPTION OF THE INVENTION

Figure 3:
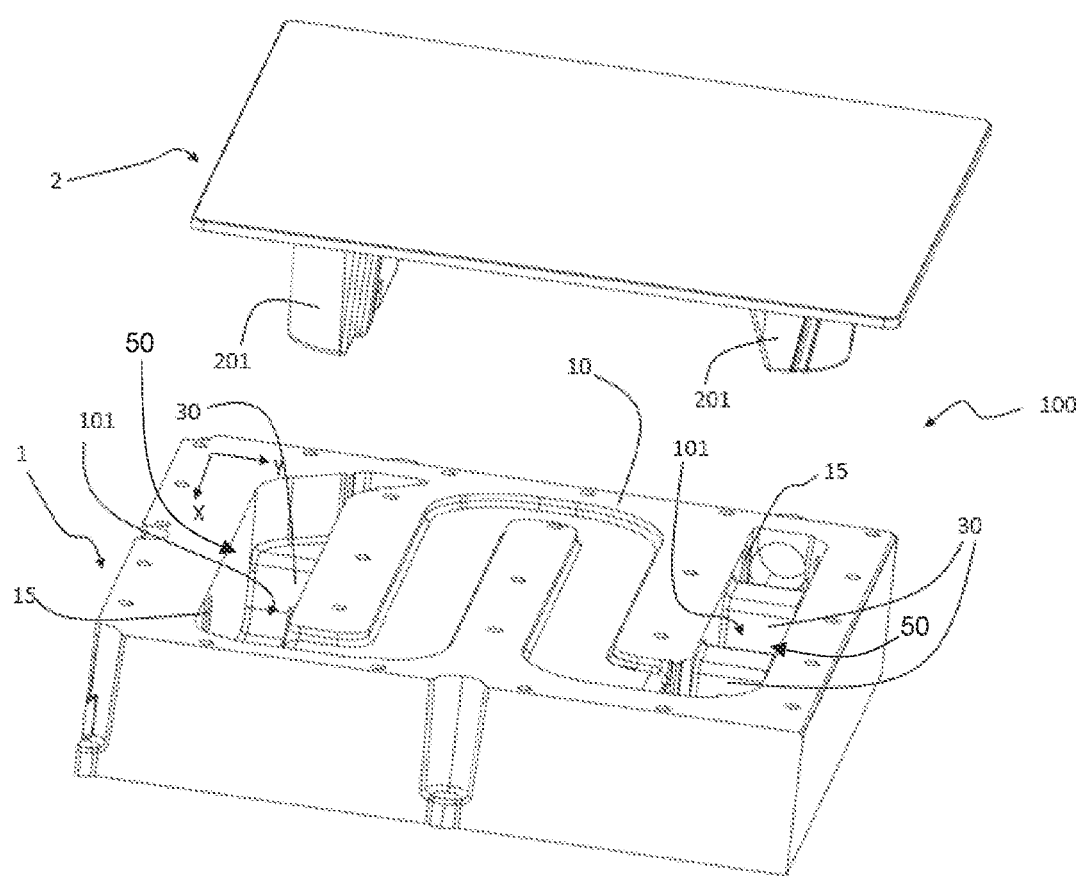
FIG. 3.

FIG. 3 shows an exploded view of a cooling circuit 100 being able to be integrated in a casing of electrical equipment, in an exemplary, non-limiting embodiment of the invention.

The cooling circuit 100 comprises a first portion of cooling circuit 10, notably belonging to a first casing part 1 forming a part of a frame of an electrical equipment, and a second portion of cooling circuit 20, notably belonging to a second casing part 2 forming a closing for said electrical equipment frame.

The first and second portions of cooling circuit 10, 20 form, once assembled, a fluid cooling circuit configured to enable the circulation of a coolant, notably a cooling liquid, for example water and/or glycol, in a "three dimensional" circulation channel formed by said portions of cooling circuit 10, 20. The "three dimensional" circulation channel has, once formed, a preferably constant section, in order to minimise pressure losses, and extends in non-coplanar directions, in the sense that the coolant called to circulate in said "three dimensional" circulation channel undergoes non-coplanar changes of direction; thus, the mean direction of the coolant undergoes non-coplanar changes. The circulation channel thus has different levels laid out successively one after the other along said circulation channel. In other words, the circulation channel is configured in such a way that a coolant circulating in said channel undergoes a change of direction to pass from one level to the other.

Figure 4A:
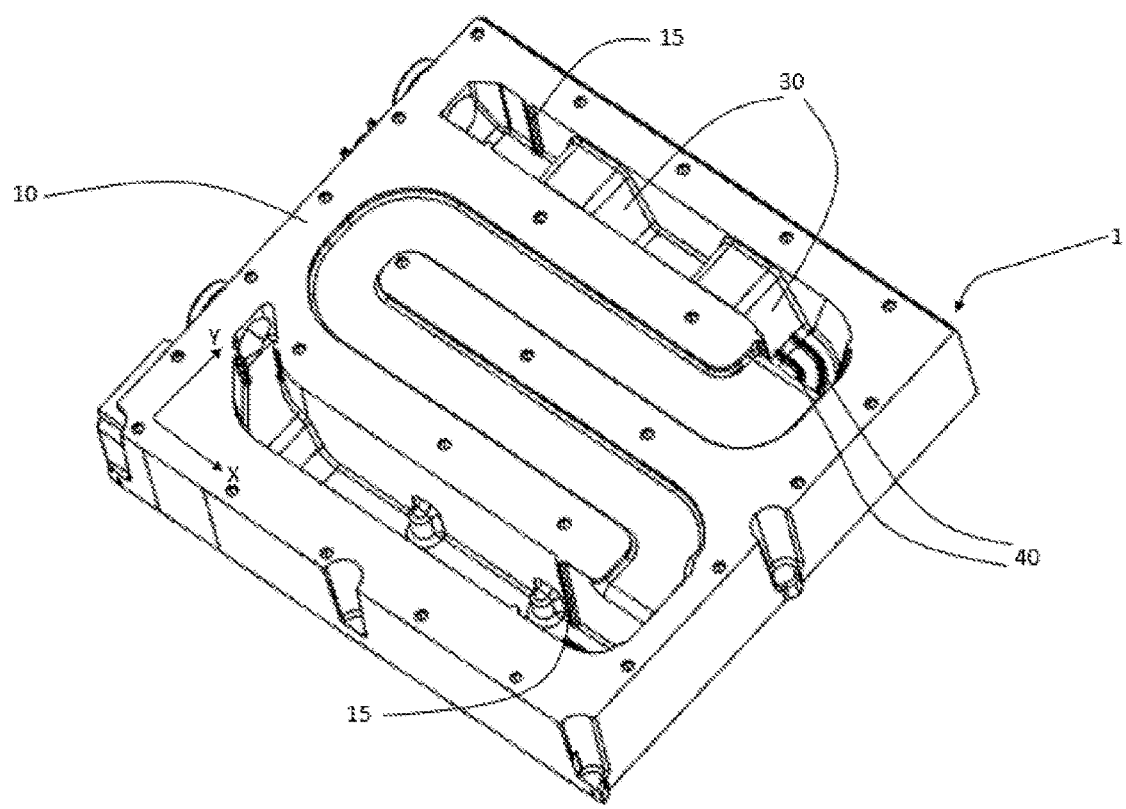
FIG. 4A.
Figure 4B:
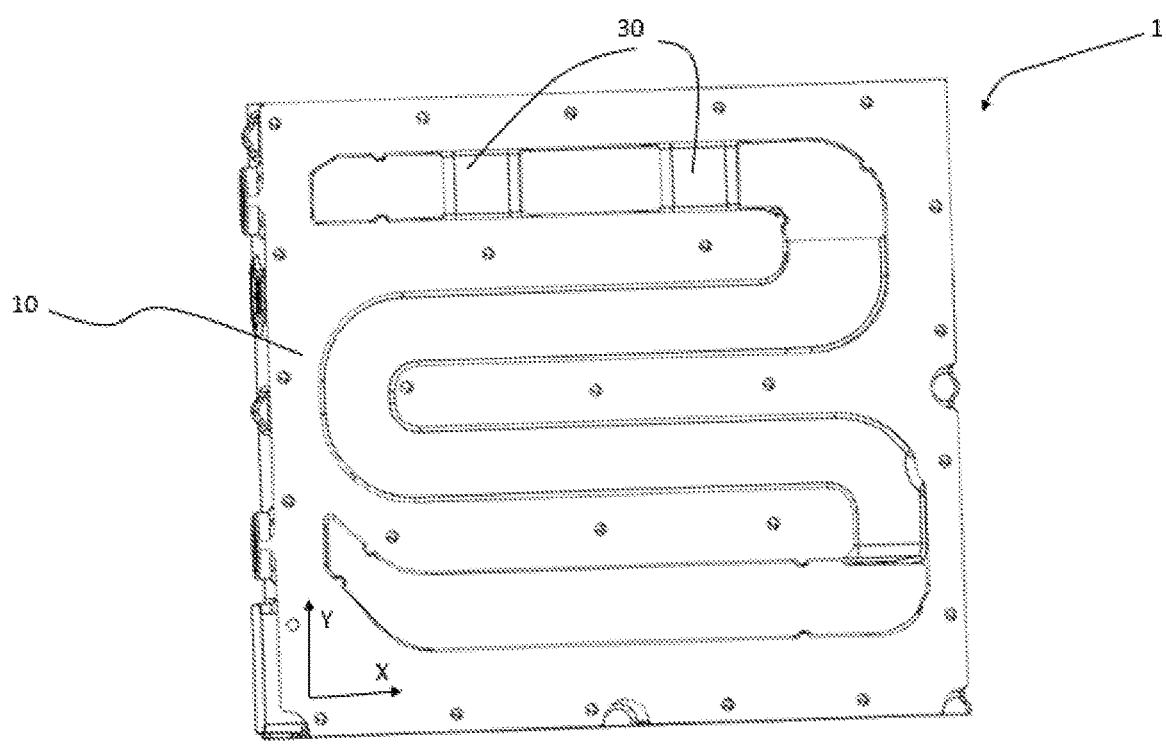
FIG. 4B.
Figure 5:
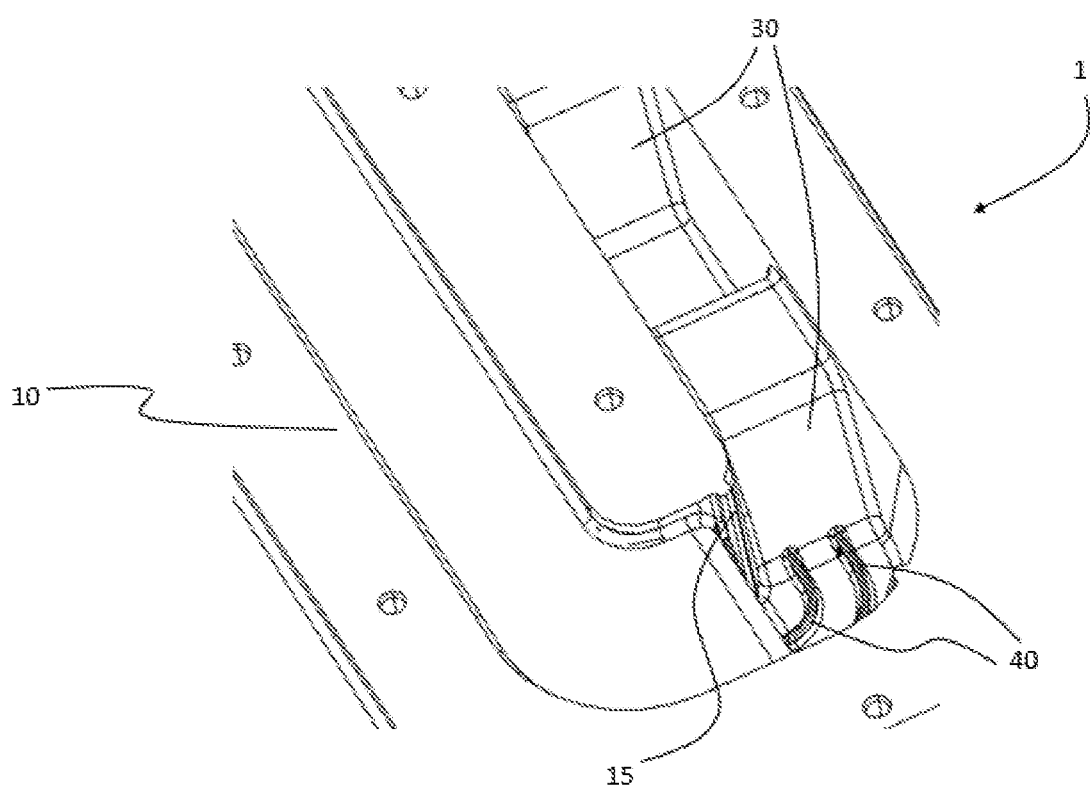
FIG. 5.
Figure 6:
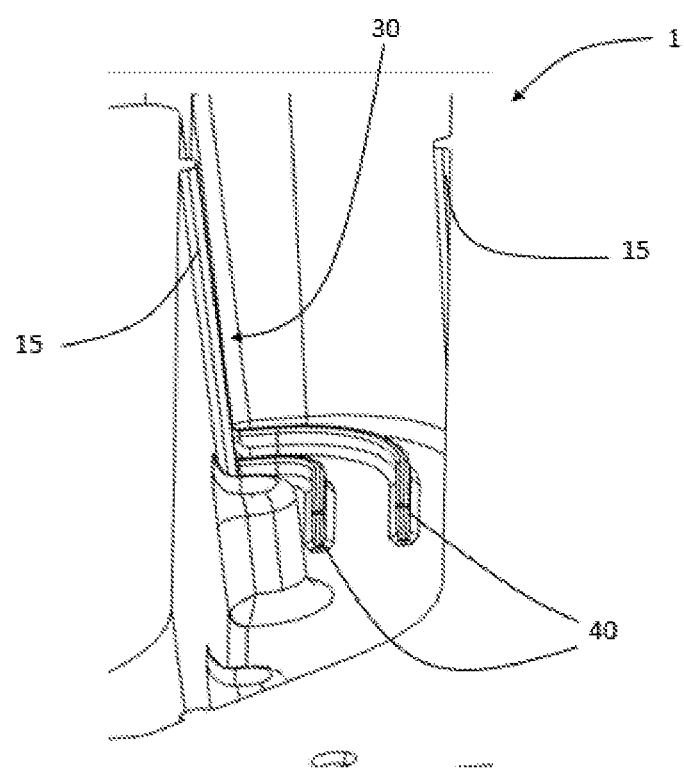
FIG. 6.
Figure 7:
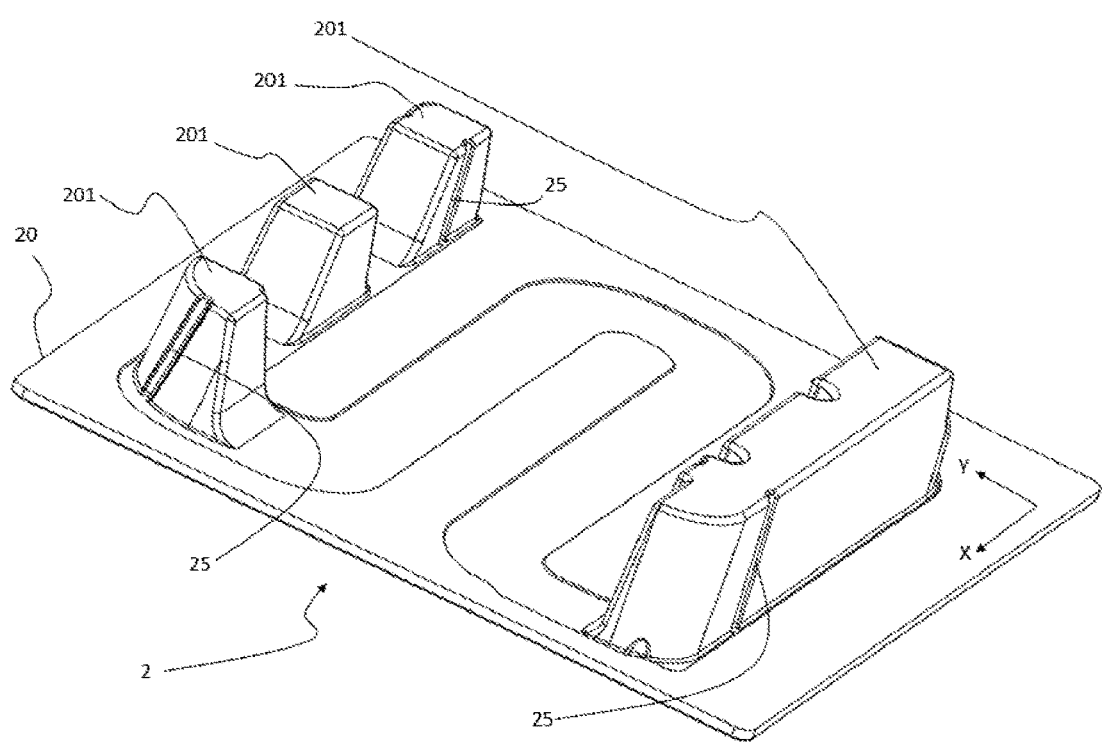
FIG. 7.

In particular, in an exemplary embodiment, the first portion of circuit 10, arranged on the first portion of cooling circuit 10, represented in FIG. 4A, comprises hollow parts 101 and the second portion of circuit 20, arranged on the second portion of cooling circuit 20, represented in FIG. 7, comprises projecting parts 201.

The hollow 101 and projecting 201 parts arranged respectively on the first 10 and on the second 20 portions of cooling circuit are complementary and configured to fit together and to form, together, a fluid cooling circuit enabling the circulation of a coolant. As explained previously, a functional clearance 50 is necessary to enable the first 10 and second 20 portions of cooling circuit to fit one into the other.

The cooling circuit thus formed is a "three dimensional" circulation channel, that is to say that it extends in non-coplanar directions. In other words, the coolant that circulates in the cooling circuit thus formed undergoes non-coplanar changes of direction.

The cooling circuit thus comprises drop offs 30, corresponding to sections of the cooling circuit on which the coolant that circulates in said cooling circuit undergoes a change of direction in a direction secant to a median plane XY corresponding to an interface plane between the first 10 and the second 20 portions of cooling circuit.

The interface between said first 10 and second 20 portions of cooling circuit 100 comprises for example a respective flat peripheral border of said first 10 and second 20 portions of casing. A median plane XY may be defined as the plane comprising such an interface; it is, in other words, a median plane XY in which at least one contact line is established between said first 10 and second 20 parts of cooling circuit 100. A peripheral seal may be provided between the first 10 second 20 portions of cooling circuit 100; said peripheral seal is then arranged in the median plane XY. Said peripheral seal is then arranged between the respective flat peripheral borders of said first 10 and second 20 portions of cooling circuit 100.

Figure 1:
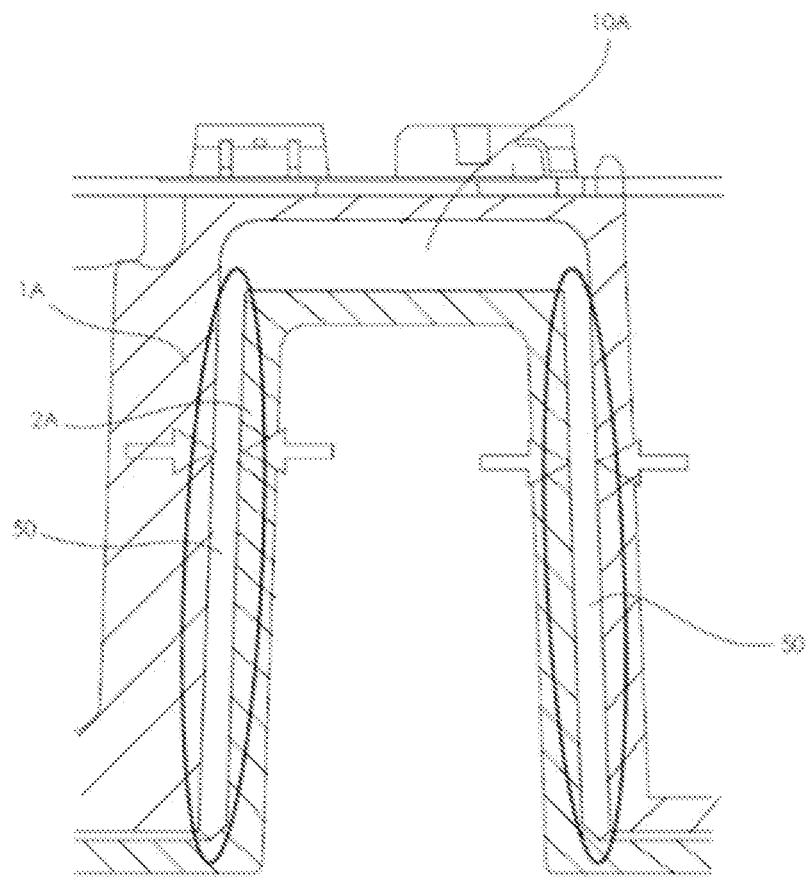
FIG. 1.
Figure 2:
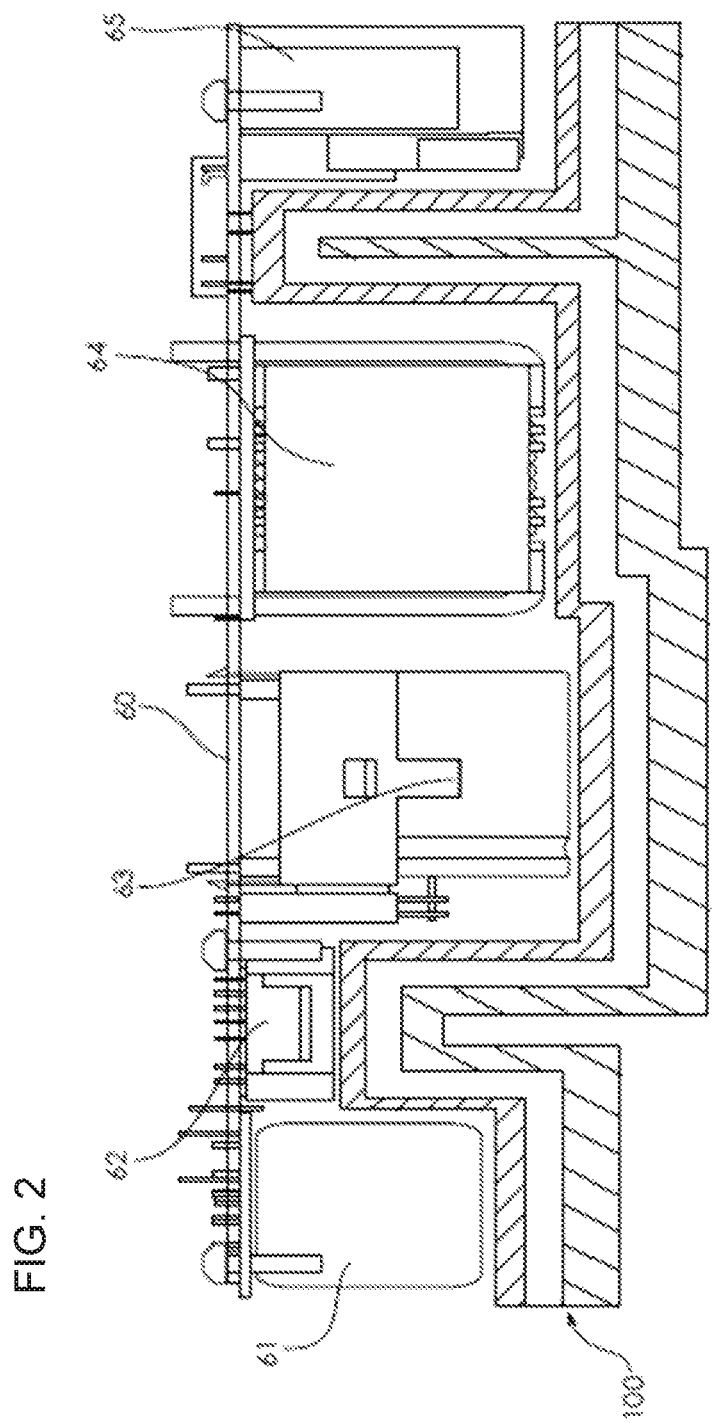
FIG. 2.

With reference to FIG. 2, the "three dimensional" character of the circulation channel makes it possible, in particular, to convey the coolant as near as possible to electronic components 61, 62, 63, 64, 65 arranged in a frame. In an electrical equipment, notably in an electric charger for vehicle, the electronic components are not in fact necessarily all arranged on a same level with respect to the median plane such as defined above. For example, said electronic components may not be arranged on a same support card. Or then, as in FIG. 2, said electronic components 61, 62, 63, 64, 65 may be mounted on a same support card 60 but do not have the same dimensions, which implies that their distance to the plane median XY is variable.

Thus, said electronic components 61, 62, 63, 64, 65 are not necessarily all found in a same plane. Thanks to a "three dimensional" circulation channel, in other words having several successive levels, such as defined above with regard to FIGS. 2, 3, 4A, 4B, 5, 6 and 7, the coolant is conveyed, in the frame, to different levels, in other words to different altitudes with respect to the median plane XY, in such a way that the coolant can be found as close as possible to each electrical component needing to be cooled. The efficiency of the cooling circuit is thus improved.

In order to prevent a part of the coolant getting inside the functional clearance 50, the first 10 and second 20 complementary portions of cooling circuit comprise deflectors mainly laid out on sections identified as "strategic" of the "three dimensional" circulation channel.

In particular, the deflectors are formed of grooves 25 and ribs 15, said ribs 15 and said grooves 25 being complementary, in the sense that one of the first 1 and second 2 parts of the casing comprises at least one rib 15 which engages in at least one corresponding groove 25 arranged in the other part of the cooling circuit. Notably, said guiding rib 40 extends into a level of the circulation channel.

According to an embodiment, there may be only ribs 15, even if the efficiency may be reduced.

The deflectors thus formed are configured to deviate the flow of coolant so as to prevent it getting inside the functional clearance 50.

Preferably, the deflectors 15, 25 are provided on sections of the "three dimensional" circulation channel situated upstream of sections on which a sudden change of direction exists. According to a preferred embodiment, deflectors are provided upstream of important drop offs 30 existing in the three dimensional channel. For example, deflectors are provided when a drop off 30 at around 90° and of a height greater than half the width of the channel exists in the three dimensional channel, said height being greater than the height of the section of the channel upstream of said drop off 30. In this case, a deflector is notably arranged upstream of said drop off 30.

According to an embodiment, two deflectors are provided on either side of the three dimensional channel, upstream of each drop off 30, said deflectors extending along a direction parallel to the corresponding drop off 30. In particular, the cooling circuit may comprise a plurality of deflectors comprising at least one rib 15 projecting into one at least of said first 10 and second 20 complementary circuit portions and at least one groove 25 hollowed out in one at least of said first 10 and second 20 complementary circuit portions, in a corresponding manner.

Each drop off 30 then comprises a rib 15. Preferably, each deflector is composed of a rib 15, arranged on one or the other of the first 10 and second 20 portions of cooling circuit and, on the other of said first 10 and second 20 portions of cooling circuit, a groove 25 in which the corresponding rib 15 engages when the first 10 and second 20 portions of cooling circuit 100 are assembled.

In the latter case, an additional advantage resides in the fact that the engagement of each rib 15 in a groove 25 participates in the guiding of the first 10 and second 20 portions one with respect to the other during their interlocking, or even to participate in the stiffening of the cooling circuit 100 thus obtained.

The circulation channel may furthermore comprise, on sections, notably turning sections, guiding ribs 40 for guiding the coolant in the circulation channel. The guiding ribs 40 have for example a height comprised between 2 mm and 3 mm.

According to a preferred embodiment, the cooling circuit 100 according to the invention is integrated in a casing for an electrical equipment. The casing comprises a first casing part 1 comprising the first portion of cooling circuit 10 and a second casing part 2 comprising the second portion of cooling circuit 20.

In this case, said first casing part 1 comprises a housing configured to receive electronic components 61, 62, 63, 64, 65 of said electrical equipment, said housing being opposite to the first portion of the cooling circuit 10 and the second casing part 2 forms a cover configured to come on one face of the casing opposite to said housing so as to form said cooling circuit 100. The second casing part 2 may also comprise a housing configured to receive electronic components of said electrical equipment, said housing being opposite to the second portion of the cooling circuit 20.

In other words, the first 1 and the second 2 parts fit into one another, for example a frame 1 and a cover 2 of an electrical equipment fit one into the other, such that first and second portions 10, 20 of cooling circuit arranged respectively in one and the other of said first 1 and second 2 parts of cooling circuit form, by assembly, the circulation channel. The median plane XY is then typically parallel to a plane in which the cover 2 extends and orthogonal to a lateral wall of the frame 1.

The invention claimed is:

1. An electrical equipment comprising a casing having a cooling circuit;
   the cooling circuit comprising a first portion and a second portion, said first and second portions of the cooling circuit being complementary and respectively comprising hollow parts and projecting parts configured to fit one into the other so as to form by assembly a circulation channel for a coolant, said circulation channel being configured to generate a flow of coolant extending over different levels laid out successively one after the other along said circulation channel;
   the hollow parts and the projecting parts being configured to fit one into the other by way of a functional clearance enabling the imbrication of said hollow parts and said projecting parts, one at least of said first and second complementary circuit portions comprising at least one deflector configured to divert the coolant from said functional clearance;
   wherein a first casing part of the casing comprises the first portion of the cooling circuit and a second casing part comprises the second portion of the cooling circuit, the first casing part comprising a housing configured to receive electronic components of the electrical equipment, the housing being opposite to the first portion of the cooling circuit;
   wherein the second casing part forming a cover configured to come on one face of the casing opposite to said housing so as to form said cooling circuit; and
   wherein the electrical equipment further comprises electronic components arranged in the housing of the casing at different distances from a plane comprising a contact line between the first and second portions of the cooling circuit, wherein the circulation channel is configured to convey the coolant to near to said electronic components so as to cool them.

2. The electrical equipment according to claim 1, wherein said at least one deflector comprises a rib projecting into one at least of said first and second complementary circuit portions.

3. The electrical equipment according to claim 1, wherein said at least one deflector comprises a groove hollowed out in one at least of said first and second complementary circuit portions.

4. The electrical equipment according to claim 1, wherein said at least one deflector comprises a rib and a groove respectively arranged on one and the other of said first and second portions of the cooling circuit, said rib and said groove being configured so that the rib engages in said groove during the interlocking of said first and second portions of the cooling circuit.

5. The electrical equipment according to claim 1, wherein the circulation channel for coolant has a substantially constant transversal section.

6. The electrical equipment according to claim 1, having a median plane comprising at least one contact line between the first and second portions of the cooling circuit, said circulation channel comprising at least one section forming a drop off, in a direction non-parallel to said median plane, and said section extending between two successive levels of said circulation channel.

7. The electrical equipment according to claim 6, wherein said at least one deflector is arranged upstream and downstream of said at least one drop off and extends in a direction orthogonal to the sense of circulation of the coolant.

8. The electrical equipment according to claim 6, comprising a pair of deflectors, facing each other, arranged on either side of the circulation channel, upstream or downstream of said at least one drop off.

9. The electrical equipment according to claim 6, wherein said first and second portions of cooling circuit respectively comprise a flat border belonging to the median plane, said first and second portions of cooling circuit being in plane-plane contact along their flat border.

10. The electrical equipment according to claim 1, wherein the circulation channel for coolant furthermore comprises at least one guiding rib, arranged on at least one section of at least one of said first and second complementary circuit portions, in the sense of circulation of the coolant, to participate in the guiding of the coolant in the circulation channel.

11. The electrical equipment according to claim 1, forming a DC-DC voltage converter, and/or an inverter and/or an electric charger, for electric or hybrid vehicle.

* * * * *